(12) United States Patent
Tokida et al.

(10) Patent No.: US 8,500,315 B2
(45) Date of Patent: Aug. 6, 2013

(54) LIGHT EMITTING MODULE AND AUTOMOTIVE HEADLAMP

(75) Inventors: Tsukasa Tokida, Shizuoka (JP); Hiroyuki Ishida, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 311 days.

(21) Appl. No.: 12/796,622

(22) Filed: Jun. 8, 2010

(65) Prior Publication Data

US 2010/0315829 A1    Dec. 16, 2010

(30) Foreign Application Priority Data

Jun. 12, 2009   (JP) ................................. 2009-141218

(51) Int. Cl.
*B60Q 1/04*  (2006.01)
(52) U.S. Cl.
USPC ......................................... 362/538; 362/293
(58) Field of Classification Search
USPC ................................................ 362/538, 293
See application file for complete search history.

(56) References Cited

U.S. PATENT DOCUMENTS

| | | | |
|---|---|---|---|
| 7,626,210 B2 | 12/2009 | Shchekin et al. | |
| 7,863,636 B2 | 1/2011 | Sakata et al. | |
| 2004/0257827 A1 * | 12/2004 | Ishida et al. | 362/545 |
| 2005/0269582 A1 * | 12/2005 | Mueller et al. | 257/94 |
| 2008/0111143 A1 * | 5/2008 | Ishida et al. | 257/95 |
| 2009/0091237 A1 * | 4/2009 | Hirosaki et al. | 313/495 |

FOREIGN PATENT DOCUMENTS

| | | |
|---|---|---|
| JP | 59-60681 | 4/1984 |
| JP | 2006-005367 | 1/2006 |
| JP | 2006-093399 A | 4/2006 |
| JP | 2007-059864 | 3/2007 |
| JP | 2008-123837 A | 5/2008 |
| JP | 2009099716 A | 5/2009 |
| WO | 2008078299 A1 | 7/2008 |

OTHER PUBLICATIONS

Notification of Reasons for Refusal, Oct. 23, 2012, 2 pages.
JPO, Office Action in counterpart Japanese Patent Application No. 2009-141218 dated Jun. 18, 2013.

* cited by examiner

*Primary Examiner* — Anh Mai
*Assistant Examiner* — Brenitra M Lee
(74) *Attorney, Agent, or Firm* — Fulwider Patton LLP

(57) ABSTRACT

A light emitting module includes: a semiconductor light emitting element; a plate-shaped light wavelength conversion ceramic that is provided so as to face the light emitting surface of the semiconductor light emitting element and that is configured to convert the wavelength of the light, which has been emitted by the semiconductor light emitting element; and a reflective film that is formed on the surface of the light wavelength conversion ceramic and that is configured to shield part of the light, which has been transmitted through the light wavelength conversion ceramic. The light wavelength conversion ceramic is composed on an inorganic material.

7 Claims, 3 Drawing Sheets

LIGHT EMITTING MODULE AND AUTOMOTIVE HEADLAMP

CROSS-REFERENCE TO RELATED APPLICATION

This application is based upon and claims the benefit of priority from the prior Japanese Patent Application No. 2009-141218, filed on Jun. 12, 2009, the entire contents of which are incorporated herein by reference.

BACKGROUND OF THE INVENTION

1. Field of the Invention

The present invention relates to a light emitting module and an automotive headlamp used in an automobile, etc.

2. Description of the Related Art

Recently, for the purpose of long life or reduction in power consumption, a technique has been developed in which a light emitting module having a light emitting element, such as an LED (Light Emitting Diode), is used as a light source for emitting strong light, such as a lamp unit that emits light toward the front of a vehicle. However, in order to be used in such an application, a light emitting module is required to emit light with high luminance. Herein, in order to improve, for example, the extraction efficiency of white light, a lighting device has been proposed, the lighting device comprising: a light emitting element that mainly emits blue light; a yellow phosphor that mainly emits yellow light by being excited with the blue light; and a blue-transmitting/yellow-reflecting means through which the blue light from the light emitting element is transmitted and by which the light from the yellow phosphor, the wavelength of which is larger than or equal to that of the yellow light, is reflected (for example, Japanese Patent Application Publication No. 2007-59864).

However, when converting a wavelength of light by using a common powdered phosphor, the luminance of the light is weakened when the light hits the particle of the phosphor, and hence it is difficult to realize high use efficiency of light. Therefore, a structure has been proposed in which a ceramic layer that is arranged in the path of the light emitted by, for example, a light emitting layer, is provided (for example, Japanese Patent Application Publication No. 2006-5367).

In recent years, semiconductor light emitting diodes (LEDs), which are small in size and light in weight and excellent in luminous efficiency, are increasingly used in automotive lamps including headlamps. The light emitting surface of an LED tip used as a light source is usually rectangular-shaped. Accordingly, in the automotive headlamp using an LED as a light source, a shade for forming a cutoff line is separately needed when a light distribution pattern for low beam is to be formed.

However, because part of the light, which has been emitted from a light source, becomes useless due to such a shade, further improvement is required from the viewpoint of the utilization rate of light.

SUMMARY OF THE INVENTION

The present invention has been made in view of these situations, and an object of the invention is to provide a light emitting module in which a light distribution pattern having a desired light-shielding area can be formed without using a separate shade.

In order to solve the aforementioned challenge, a light emitting module according to an embodiment of the present invention comprises: a light emitting element; a plate-shaped light wavelength conversion member that is provided so as to face the light emitting surface of the light emitting element and that is configured to convert the wavelength of the light, which has been emitted by the light emitting element; and a light-shielding film that is formed on the surface of the light wavelength conversion member and that is configured to shield part of the light, which has been transmitted through the light wavelength conversion member. The light wavelength conversion member is composed of an inorganic material.

According to this embodiment, because the light wavelength conversion member is composed of an inorganic material, the light wavelength conversion member can be accurately processed or formed in comparison with the case where a powdered phosphor is dispersed in a resin. Further, the flatness of the surface is improved by using such a light wavelength conversion member. Thereby, a light-shielding film can be easily and accurately formed on the surface of a light wavelength conversion member. That is, a light distribution pattern having a desired shielding area can be formed without using a separate shade.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
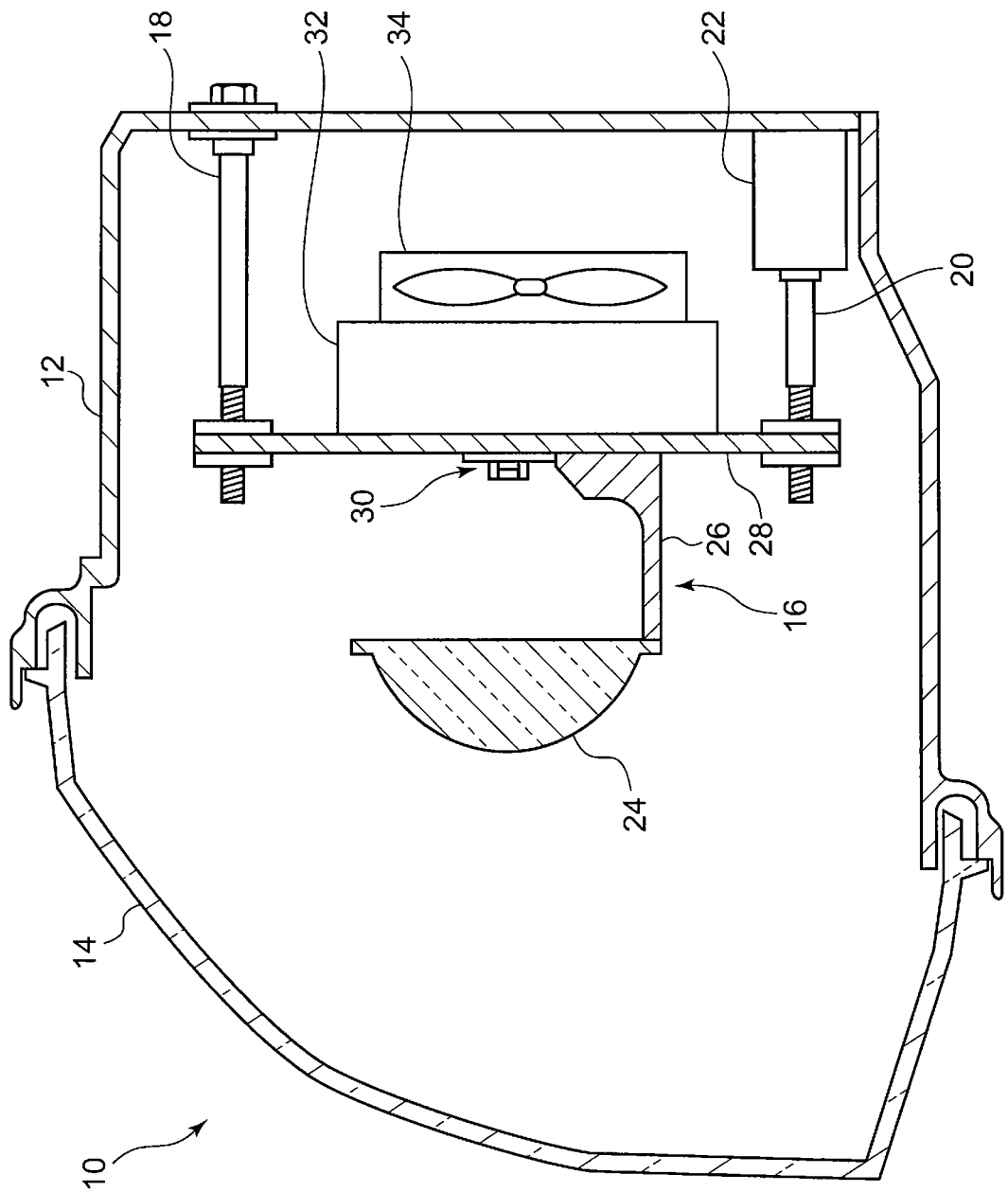
FIG. 1 is a cross-sectional view illustrating the structure of an automotive headlamp according to the present embodiment.

The invention will now be described by reference to the preferred embodiments. This does not intend to limit the scope of the present invention, but to exemplify the invention.

The present invention will now be described in detail based on preferred embodiments with reference to the accompanying drawings. The same constituents illustrated in each drawing will be denoted with the same reference numerals, and the duplicative descriptions thereof are appropriately omitted.

FIG. 1 is a cross-sectional view illustrating the structure of an automotive headlamp 10 according to the present embodiment. The automotive headlamp 10 comprises a lamp body 12, a front cover 14, and a lamp unit 16. Hereinafter, description will be made assuming that, in FIG. 1, the side of the front cover 14 is the lamp front and the side of the lamp body 12 is the lamp back. Further, it is assumed that, when viewing the direction toward the front cover 14 (the front of the lamp) from a light source, which will be described later, the right side is the lamp right side and the left side is the lamp left side. FIG. 1 illustrates, when viewed from the lamp left side, the cross section of the automotive headlamp 10 that is cut by a vertical plane including the light axis of the lamp unit 16. When installing the automotive headlamps 10 in a vehicle, two automotive headlamps 10, both of which are formed symmetrically to each other, are provided in each of the left front and the right front of the vehicle, respectively. FIG. 1 illustrates the structure of either of the two automotive headlamps 10.

The lamp body 12 is formed into a box shape with an opening. The front cover 14 is formed into a bowl shape with a resin or glass having translucency. The edge of the front cover 14 is fixed to the opening of the lamp body 12. Thus, a lamp chamber is formed in the area covered with the lamp body 12 and the front cover 14.

A lamp unit 16 is arranged in the lamp chamber. The lamp unit 16 is fixed to the lamp body 12 with aiming screws 18 and 20. The aiming screw 20, located at a lower position, is configured to be rotated by operating a leveling actuator 22. Accordingly, it is possible that the light axis of the lamp unit 16 is transferred in the vertical direction by operating the leveling actuator 22.

The lamp unit 16 has a projection lens 24, a support member 26, a bracket 28, a light emitting device 30, a radiating fin 32, and a radiating fan 34. The projection lens 24 is composed of a plano-convex aspheric lens, the surface on the lamp front side of which is convex-shaped and that on the lamp back side of which is flat-shaped, and the projection lens 24 projects, as an inverted image, the image of the light source that is formed on the back focal plane into the lamp front direction. The support member 26 supports the projection lens 24. The light emitting device 30 is provided with a light emitting module 36. The projection lens 24 functions as an optical member that collects the light, which has been emitted by the light emitting module 36, toward the lamp front direction. The radiating fin 32 is fixed to the surface on the back side of the bracket 28, and the radiating fan 34 is provided on the back side of the radiating fin 32. The radiating fin 32 and the radiating fan 34 radiate the heat, which has been emitted mainly by the light emitting module 36.

The automotive headlamp 10 is used as a light source for low beam, and forms, in front of a vehicle, a light distribution pattern for low beam having a cutoff line by shielding part of the emitted light with a reflective film that is formed on the surface of the light emitting module 36, the reflective film being described later. A light distribution pattern for low beam is publicly known, and hence the description thereof will be omitted.

Figure 2:
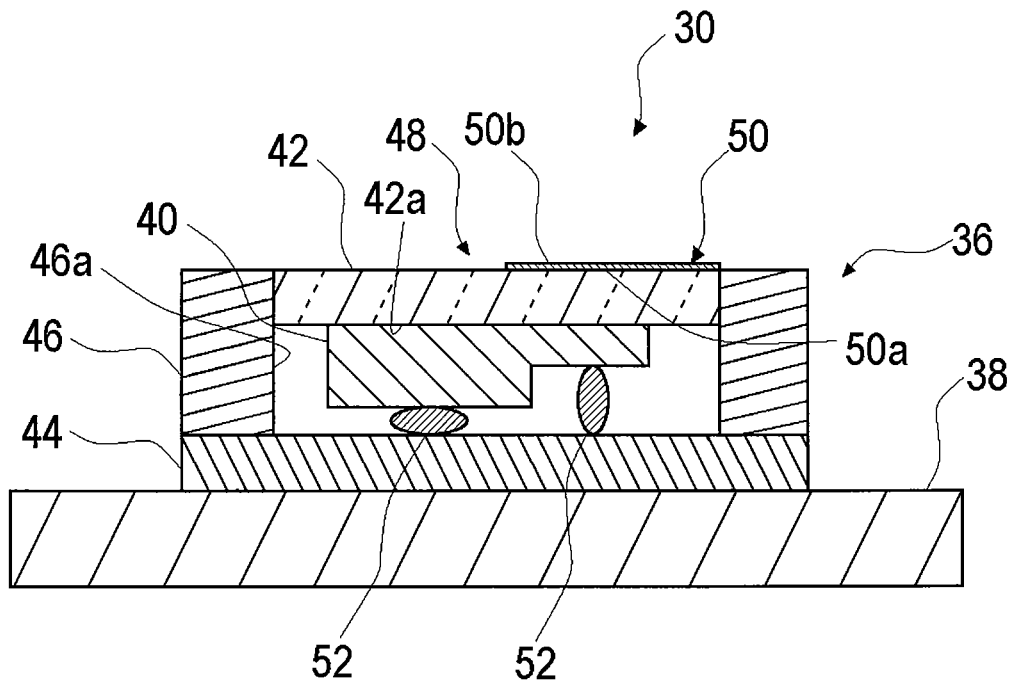
FIG. 2 is s cross-sectional view illustrating the structure of a light emitting device according to the present embodiment.

FIG. 2 is a cross-sectional view illustrating the structure of the light emitting device 30 according to the present embodiment. The light emitting device 30 has the light emitting module 36 and a substrate 38. The substrate 38 is a printed circuit board, to the upper surface of which the light emitting module 36 is fixed. The light emitting module 36 has a device mounting substrate 44, a reflective substrate 46, a semiconductor light emitting element 40, and a ceramic unit 48. In the light emitting module 36 according to the present embodiment, the plate-shaped ceramic unit 48 is provided so as to face the light emitting surface of the semiconductor light emitting element 40.

The device mounting substrate 44 is formed into a plate shape with a material having high thermal conductivity, such as AlN, SiC, Al2O3, and Si. The reflective substrate 46 is formed into a shape in which a through-hole 46a is provided at the center of the rectangular parallelepiped shaped member. The inner surface of the through-hole 46a is subjected to mirror surface processing in which aluminum or silver is deposited or sputtered thereon in order to reflect light.

The semiconductor light emitting element 40 is composed of an LED element. In the present embodiment, a blue LED, which emits mainly the light with a blue wavelength, is used as the semiconductor light emitting element 40. Specifically, the semiconductor light emitting element 40 is composed of a GaN LED element, which is formed with a GaN semiconductor layer being subjected to crystal growth on a sapphire substrate. The semiconductor light emitting element 40 is formed as, for example, a chip of a size of 1 mm square, and is structured such that the central wavelength of the blue light, which is emitted therefrom, is 460 nm. It is needless to say that the structure of the semiconductor light emitting element 40 and the wavelength of the light, which is emitted from the light emitting element 40, shall not be limited to those stated above.

The ceramic unit 48 is a light wavelength conversion member and is composed of at least light wavelength conversion ceramic 42. The light wavelength conversion ceramic 42 is formed by dicing light wavelength conversion ceramic, which has been formed into a plate shape with a thickness of 50 μm or more and less than 1000 μm, so that the size thereof is larger than that of the semiconductor light emitting element 40 by 5% or more and 10% or less. It is needless to say that the size of the light wavelength conversion ceramic 42 shall not be limited thereto, and may be diced, for example, so as to have the same size as of the semiconductor light emitting element 40. Alternatively, the light wavelength conversion ceramic 42 may be diced so as to have a size that is larger than that of the semiconductor light emitting element 40 by more than 10%, or by more than 0 and less than 5%.

The light wavelength conversion ceramic 42 is so called light emitting ceramic or fluorescent ceramic, and can be obtained by sintering a ceramic base material, which has been made by using YAG (Yttrium Alminium Garnet) powder, which is a phosphor excited by blue light. Because a production method of such light wavelength conversion ceramic is publicly known, the description thereof will be omitted. In a light wavelength conversion ceramic 42 thus obtained, the dispersion of light on the surface of the powder can be suppressed, different from, for example, a powdered phosphor, thereby making a loss of the light that has been emitted by the light emitting element 40 very small.

The light wavelength conversion ceramic 42 converts the wavelength of the blue light, which has been emitted mainly by the semiconductor light emitting element 40, so that yellow light is emitted. Accordingly, synthesized light that has been synthesized from both the blue light, which has been transmitted through the light wavelength conversion ceramic 42 as it is, and the yellow light whose wavelength has been converted by the light wavelength conversion ceramic 42, is emitted from the light emitting module 36. As stated above, the light emitting module 36 can emits white light.

Alternatively, transparent ceramic is also used as the light wavelength conversion ceramic 42. In the present embodiment, the "transparency" means that the total light transmittance in the light wavelength region to be converted is greater than or equal to 40 percent. As a result of intensive research and development by the inventor, it has been learned that light wavelength can be appropriately converted by the light wavelength conversion ceramic 42 and that a decrease in the light intensity of the light, which is transmitted through the light wavelength conversion ceramic 42, can be appropriately suppressed, if the light wavelength conversion ceramic 42 is transparent in which the total light transmittance in the light wavelength region to be converted is greater than or equal to 40%. Accordingly, the light that is emitted by the semiconductor light emitting element 40 can be efficiently converted with the light wavelength conversion ceramic 42 having such a transparent state.

Further, the light wavelength conversion ceramic 42 is composed of an inorganic material, and hence is improved in durability in comparison with the case where an organic material is contained in the binder. Accordingly, the light emitting module 36 can be supplied with, for example, power greater than or equal to 1 W (watt), thereby allowing for the luminance and light intensity of the light, emitted by the light emitting module 36, to be enhanced.

Alternatively, a light emitting element that emits mainly light with a light wavelength other than that of blue light can be used as the semiconductor light emitting element 40. Also, in this case, a light wavelength conversion ceramic that converts mainly the wavelength of the light, which is emitted by the semiconductor light emitting element 40, is used as the light wavelength conversion ceramic 42. Also, in this case, the light wavelength conversion ceramic 42 may converts the wavelength of the light, which has been emitted by the semiconductor light emitting element 40, so that the wavelength of white light or light close to white light is created by combining mainly with the wavelength of the light, which has been emitted by the semiconductor light emitting element 40.

Figure 3:
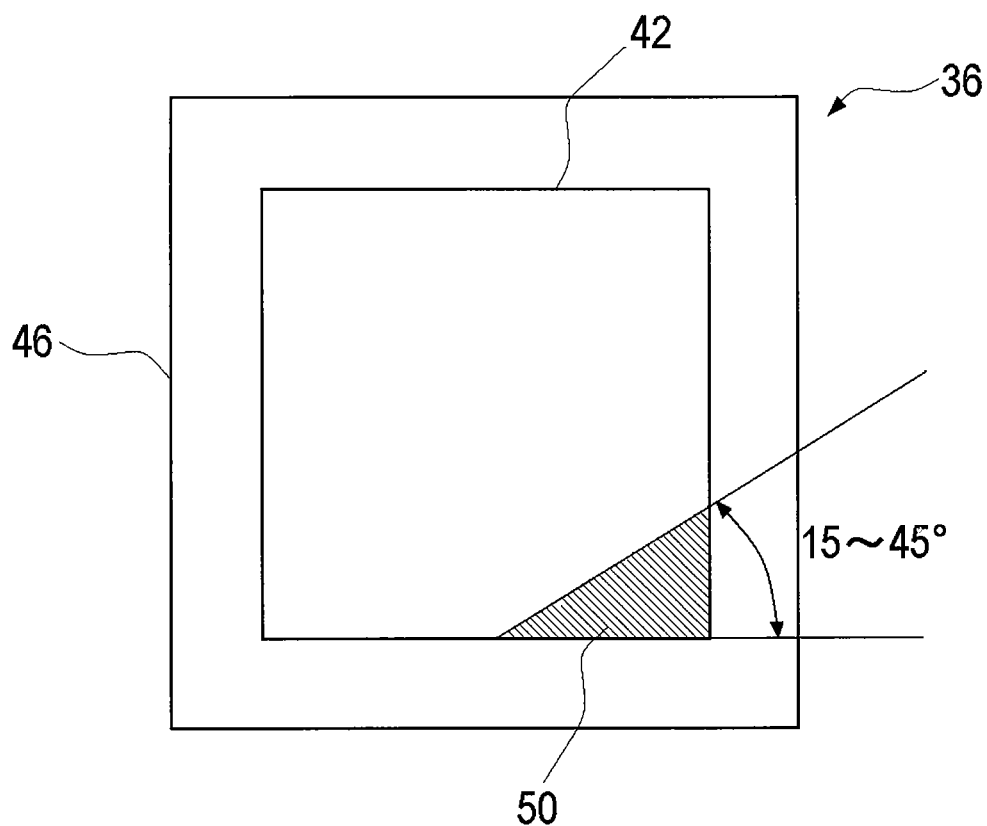
FIG. 3 is a top view of the light emitting module illustrated in FIG. 2.

A reflective film 50 is formed, of both surfaces of the light wavelength conversion ceramic 42, in part of the surface thereof, which is opposite to the surface on which the semiconductor light emitting element 40 is arranged. That is, the reflective film 50 is arranged in part of the surface from which light is emitted. FIG. 3 is a top view of the light emitting module 36 illustrated in FIG. 2. As illustrated in FIG. 3, the reflective film 50 according to the present embodiment is formed into a triangular shape in one of the four corners of the surface of the rectangular-shaped light wavelength conversion ceramic 42. The reflective film 50 functions as a light-shielding film for shielding part of the light that has been transmitted through the light wavelength conversion ceramic 42.

The light emitting module 36 according to the present embodiment can be used in various applications. For example, when the light emitting module 36 is used as a light source of an automotive headlamp that forms a light distribution pattern for low beam, the reflective film 50 is set such that the angle formed between the oblique side of the triangular shape and one side of the light wavelength conversion ceramic 42 is within a range of 15 degree to 45 degree. Thereby, a light distribution pattern having an oblique cutoff line, for example, as required in the headlamp for a low beam of an automobile, can be formed without using a separate shade.

The shape of the reflective film 50 is not necessarily limited to a triangular shape, but may be appropriately determined in accordance with the application or light distribution required of the light emitting module 36. For example, the reflective film 50 may be formed, in a dispersed manner, at a plurality of positions on the surface of the light wavelength conversion ceramic 42 without being limited to one position.

The reflective film 50 is made by forming a thin film of aluminum, silver, or a gold with deposition or sputtering. The reflective film 50 shields part of the light that has been transmitted through the light wavelength conversion ceramic 42 by the reflecting surface 50a (see FIG. 2), and also reflects the part of the light. Therefore, by using the reflected light as part of the emitted light, the reflective film 50 can improve the light emitting efficiency of the light emitting module 36 in comparison with the case of shielding the light with a substance having a low reflectance. The exposed surface 50b of the reflective film 50 (see FIG. 2), i.e., the surface on the side that is not in contact with the light wavelength conversion ceramic 42, is composed of a thin film having a lower reflectance than that of the reflecting surface 50a. Thereby, it can be prevented that outside light, etc., is unnecessarily reflected on the surface of the light emitting module 36.

As stated above, in the light emitting module 36 according to the present embodiment, because the ceramic unit 48 is composed of an inorganic material, the ceramic unit 48 can be accurately processed or formed in comparison with the case where a powdered phosphor is dispersed in a resin. Further, the flatness of the surface of the light wavelength conversion ceramic 42 can also be improved by using such a ceramic unit 48. Thereby, a reflective film 50 with a high adhesion property can be easily and accurately formed on the surface of the light wavelength conversion ceramic 42. As stated above, a light distribution pattern having a desired shielding area can be accurately formed by the light emitting module 36, without using a separate shade.

As stated above, when forming the reflective film 50 by using a metal film, such as aluminum and silver, for example, deposition or sputtering, which is a semiconductor process, can be used. Accordingly, the reflective film 50 with high dimensional accuracy can be formed on the surface of the light wavelength conversion ceramic 42. Further, when manufacturing the ceramic unit 48 by using a semiconductor process, the reflective film 50 can be formed from one step of the semiconductor process, thereby allowing for the man-hour or the manufacturing time to be reduced.

Subsequently, a method of manufacturing the light emitting module 36 will be described in detail. At first, the reflective substrate 46 is fixed to the device mounting substrate 44 by adhesives, etc. Subsequently, the semiconductor light emitting element 40 is arranged inside the through-hole 46a of the reflective substrate 46 so as to direct the light emitting surface upward. The semiconductor light emitting element 40 is flip chip mounted on the device mounting substrate 44 through a gold bump 52.

Subsequently, the ceramic unit 48 on which the reflective film 50 has been formed beforehand is arranged above the semiconductor light emitting element 40 such that the incident plane 42a of the light wavelength conversion ceramic 42 faces the light emitting surface of the semiconductor light emitting element 40; and then the ceramic unit 48 is fixed to the semiconductor light emitting element 40 and the inner wall of the reflective substrate 46 with an adhesive. In this case, as an adhesive, a material that is excellent in light resistance, such as a silicone based material, a sol-gel silica based material, a fluorine based material, and an inorganic glass based material, is used. In the present embodiment, because the plate-shaped light wavelength conversion ceramic 42 is used, the light emitting module 36 can be accurately and easily manufactured in comparison with the case where, for example, a powdered light wavelength conversion member is mounted on the semiconductor light emitting element 40.

As stated above, the semiconductor light emitting element 40 and the light wavelength conversion ceramic 42 are arranged such that the light, which has been emitted by the semiconductor light emitting element 40, is incident on the incident plane 42a of the light wavelength conversion ceramic 42. A method of fixing the ceramic unit 48 shall not be limited to adhesion, but may be a mechanical fastening method, such as, for example, soldering, swaging, welding, and screwing.

Figure 4:
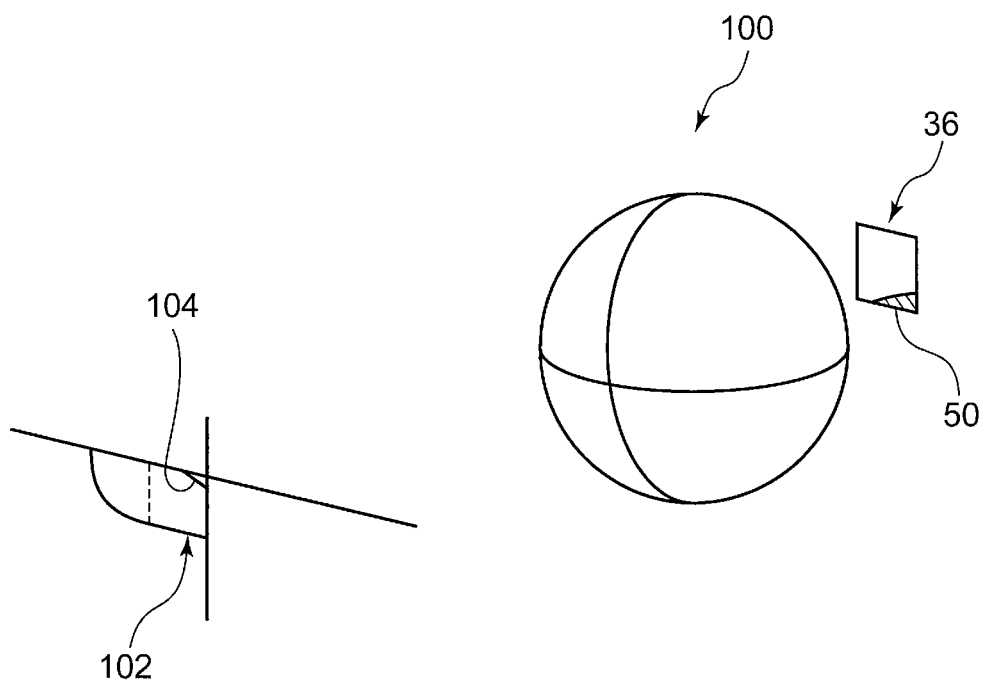
FIG. 4 is a view schematically illustrating a state of light emission from an automotive headlamp using the light emitting module according to the present embodiment.

Subsequently, the outline of the automotive headlamp using the aforementioned light emitting module 36 will be described. FIG. 4 is a view schematically illustrating a state of light emission from an automotive headlamp using the light emitting module 36 according to the present embodiment. As illustrated in FIG. 4, the automotive headlamp 100 according to the present embodiment comprises: the light emitting module 36; and a projection lens 24 as an optical member configured to project the light that has been emitted from the light emitting module 36 and to form a light distribution pattern having a cutoff line.

When being mounted in an automotive headlamp, the light emitting module 36 is arranged near the focal point of the projection lens 24 such that the light emitting surface of the semiconductor light emitting element 40 (see FIG. 2) faces the projection lens 24 and that the reflective film 50 is located below the light emitting module 36. A projection image 102 of the semiconductor light emitting element 40 by the projection lens 24 is formed on a predetermined screen, which has been virtually provided in front of the projection lens 24, as a light distribution pattern in which the shape of the light emitting surface of the semiconductor light emitting element 40 is enlarged in the transverse direction. In this case, because the reflective film 50 with a triangular shape shields part of the light emitting surface of the semiconductor light emitting element 40, an oblique cutoff line 104 is formed, as illustrated in FIG. 4.

As stated above, in the automotive headlamp 100 according to the present embodiment, a light distribution pattern having a cutoff line can be formed by using the light emitting module 36 in which the reflective film 50 is formed, without using a separate shade. Therefore, the automotive headlamp 100 can be small in size and the number of parts can be reduced.

The present invention has been described above with reference to the aforementioned embodiments. However, the present invention shall not be limited to the above embodiments, but variations in which the structures of the respective embodiments are appropriately combined or replaced, are also within the scope of the present invention. The combinations or the orders of the processes in the embodiments could be appropriately changed, or various modifications such as design modification could be made to the embodiments, based on the knowledge of a skilled person. Such modifications could be also within the scope of the present invention.

The aforementioned embodiments have been described mainly with respect to the case where the light emitting module is used in an automotive headlamp; however, the light emitting module can also be used in the whole lighting, such as, for example, road lighting and sidewalk lighting. Also, in such lighting, there is a demand for a light distribution pattern in which glare should not be provided to the targeted vehicles or people. Therefore, in these applications, each of the aforementioned advantages can be obtained by using a light emitting module in which a reflective film having a shape in accordance with a demanded light distribution pattern, is formed.

What is claimed is:

1. A light emitting module comprising:
a light emitting element;
a plate-shaped light wavelength conversion member that is provided so as to face the light emitting surface of the light emitting element and that is configured to convert the wavelength of the light, which has been emitted by the light emitting element;
a reflective substrate formed with a through hole in which the light wavelength conversion member is arranged and configured to reflect light at an inner surface of the through hole; and
a light-shielding film that is formed on the surface of the light wavelength conversion member and that is configured to shield part of the light, which has been transmitted through the light wavelength conversion member, wherein the light wavelength conversion member is a ceramic fluorescent body and is fixed to the inner surface of the through hole and the light emitting element.

2. The light emitting module according to claim 1, wherein the light-shielding film is a metal film configured to reflect the light, which has been transmitted through the light wavelength conversion member.

3. The light emitting module according to claim 1, wherein the light wavelength conversion member is rectangular-shaped, and wherein the light-shielding film is formed into a triangular shape in any one of the four corners of the surface of the light wavelength conversion member.

4. The light emitting module according to claim 2, wherein the light wavelength conversion member is rectangular-shaped, and wherein the light-shielding film is formed into a triangular shape in any one of the four corners of the surface of the light wavelength conversion member.

5. The light emitting module according to claim 3, wherein the light-shielding film is set such that the angle formed between the oblique side of the triangular shape and one side of the light wavelength conversion member is within a range of 15 degree to 45 degree.

6. The light emitting module according to claim 4, wherein the light-shielding film is set such that the angle formed between the oblique side of the triangular shape and one side of the light wavelength conversion member is within a range of 15 degree to 45 degree.

7. An automotive headlamp comprising:
the light emitting module according to claim 1; and
an optical member configured to project the light that has been emitted from the light emitting module and to form a light distribution pattern having a cutoff line.

* * * * *